United States Patent [19]
Shibata et al.

[11] Patent Number: 5,745,416
[45] Date of Patent: Apr. 28, 1998

[54] NON-VOLATILE SEMICONDUCTOR MEMORY DEVICE

[75] Inventors: Tadashi Shibata, 5-2, Nihondaira, Taihaku-ku, Sendai-shi, Miyagi-ken 982-02; Tadahiro Ohmi, 1-17-301, Komegabukuro 2-chome, Aoba-ku, Sendai-shi, Miyagi-ken 980; Yuichiro Yamashita, Sendai, all of Japan

[73] Assignees: Tadashi Shibata; Tadahiro Ohmi, both of Japan

[21] Appl. No.: 581,740

[22] Filed: Dec. 29, 1995

[30] Foreign Application Priority Data

Jan. 11, 1995 [JP] Japan .................. 7-002944

[51] Int. Cl.$^6$ .................................................. G11C 11/34
[52] U.S. Cl. ........................ 365/185.28; 365/185.18; 257/315
[58] Field of Search ...................... 365/185.28, 185.18, 365/185.01, 185.03; 257/315

[56] References Cited

U.S. PATENT DOCUMENTS

| | | | |
|---|---|---|---|
| 4,510,584 | 4/1985 | Dias et al. | 365/185.28 |
| 4,685,083 | 8/1987 | Leuschner | 365/185.28 |
| 4,780,750 | 10/1988 | Nolan et al. | 365/185.28 |
| 4,802,124 | 1/1989 | O'Brien, Jr. | 365/185.28 |
| 5,081,610 | 1/1992 | Olivo et al. | 365/185.25 |

Primary Examiner—Joseph A. Popek
Attorney, Agent, or Firm—Baker & Daniels

[57] ABSTRACT

A non-volatile semiconductor memory which is capable of high speed and highly accurate analog data writing. The memory includes a first MOS type transistor having a first floating gate which is electrically isolated. A first electrode is capacitively coupled with the first floating gate. A second electrode is connected via a tunnel junction with the first floating gate. A third electrode is capacitively coupled with the second electrode. A second MOS type transistor interconnects the first and second electrodes. A means is provided for applying a predetermined potential difference between the first and third electrodes to thereby cause a tunnel current to flow in the tunnel junction and to store an electric charge in the first floating gate to thereby cause the second MOS type transistor to conduct when the electric charge has reached a predetermined value.

8 Claims, 10 Drawing Sheets

NON-VOLATILE SEMICONDUCTOR MEMORY DEVICE

TECHNOLOGICAL FIELD

The present invention relates to a non-volatile semiconductor memory device, and in particular, relates to a memory device which permits the writing of analog and multivalent data at high speed and with great accuracy.

BACKGROUND ART

Recently, in concert with the development of computer technology, progress in data processing technology has been startling. However, as attempts have been made to realize the type of flexible information processing conducted by human beings, it has been said that obtaining results of calculations in real time with present computers is essentially impossible. The reason for this is that the information handled in daily life by human beings is in analog amounts; firstly, there are enormous amounts of such data, and moreover, this data is imprecise and vague. A problem which present data processing systems face is the complete conversion of redundant analog data into digital values, and the conduction number of strictly digital calculations one by one.

An example of this is image data. If, for example, one screen incorporates a 500×500 two-dimensional pixel array, the total number of pixels is 250,000, and if in each pixel the strength of the 3 primary colors red, green, and blue is represented by 8 bits, then a still image of one such screen requires data in an amount of 750,000 bits. In a moving image, such image data increases with the passage of time. Even employing the present supercomputers, it is said that the manipulation of an enormous amount of data expressed as "1" and "0" in real time, and the recognition and understanding of the image, is impossible.

However, in order to overcome such difficulties, attempts are being made to realize information processing which is closer to that of human beings by means of incorporating real world data which are in analog form and conducting calculations and processing on these data as analog amounts. However, the greatest problem with this approach is that there has been no memory device which is capable of maintaining the analog data over a long period of time. For example, there have been a number of attempts to realize an analog non-volatile memory by means of storing analog amounts as electric charges in floating gates; however, it has been extremely difficult to accurately write such data as predetermined voltages.

FIG. 8 depicts the problems present in the conventional technology. Reference 801 indicates floating gate, while Reference 802 indicates an NMOS transistor. In order to the amount of electric charge $Q_F$ within the floating gate to a fixed value, a voltage of 20 V, for example, is applied to the program electrode 803; this takes up the voltage of the floating gate by means of capacitive coupling, and applies a high voltage to the tunnel junction 804, causing a tunnel current to flow. The tunnel junction is commonly realized by means of a structure in which an extremely thin $SiO_2$ film of approximately 100 Å is sandwiched between two electrodes. Commonly, N-type dispersion layers, or polycrystalline silicon thin films doped with N-type impurities, are employed as these electrodes. As a result of the strong electric field which occurs within the oxide film having a thickness of 100 Å, electrons are implanted in the floating gate 801 from the ground electrode 805, and the total amount of electrons $|Q_F|$ within the floating gate increases over time. The size of the tunnel current which flows is expressed as a Fowler - Nordheim current which is given by the following formula. (Formula 1)

$$J = aE^2 \exp(-b/E) \quad (1)$$

Here, a and b are constants, J represents the current density, and E represents the field strength.

FIG. 9 is a graph showing the charge of floating gate 801 with respect to the voltage impression time when the impressed voltage was set to 15, 20, and 25 V. This was obtained by means of an HSPICE simulation; the device parameters, such As the tunnel oxide film voltage and the like, were the typical values currently employed. When the voltage has just been impressed, $|Q_F|$ rapidly increases. That is to say, the electrons are rapidly implanted in the floating gate. In FIG. 10, the time axis of the graph of FIG. 9 is made a logarithmic scale, and a sufficiently long implantation period is shown (the point at 0 seconds from voltage impression, at which $|Q_F|=0$, is omitted). It can be seen from the graph that $|Q_F|$ increases in a gently sloping curve, and even after the passage of 1000 seconds, this gently sloping increase of $|Q_F|$, that is to say, the slow implantation of electrons, continues. As is clear from FIGS. 9 and 10, if the impressed voltages caused to change, it is definitely possible to adjust the amount written into the floating gate. However, as the implantation/emission of electrons requires an extremely long period, it is impossible to accurately complete writing within a practically applicable period of time when a method is employed in which the amount written is adjusted by altering the impressed voltage.

A method has also been considered in which the pulse voltage is set to a constant value, and control is exerted by means of the pulse impression time; however, because the floating gate voltage changes extremely rapidly at the initiation of pulse impression, it is essentially impossible to accurately control the writing voltage. The only method which has reached practical application to date is a method in which, after as short pulse has been applied once to $V_{EXT}$, the value of $Q_F$ is read out.

$Q_F$ is read out by means of the following method. The threshold voltage of NMOS 802 when electrode 803 is viewed as a gate electrode is given by the following formula:

(Formula 2)

$$V_{TH}^* = \frac{C_{TOT}}{C_1} V_{TH} - \frac{Q_F}{C_1} \quad (2)$$

Here, $V_{TH}$ indicates the threshold voltage of NMOS 802 as seen from the floating gate 801, $C_1$ indicates the capacitive coupling coefficient between the floating gate and electrode 803, and $C_{TOT}$ represents the sum of the capacities connected to the floating gate. That is to say, by means of measuring the threshold voltage $V_{TH}^*$ of NNOS 802, the value of $Q_F$ can be determined. In this manner, the value of $Q_F$ is read out and if the desired value has not yet been reached, a further pulse is applied. At this time, fine control, in which the size of the pulse or the pulse width is altered, is conducted. Furthermore, when the read-out value has exceeded the desired value, a negative programming pulse can be applied to $V_{EXT}$, and a correction thus made. This type of complex series of writing/reading operations is repeatedly conducted using an external computer. By means of such a method, it is completely impossible to write data at a high rate of speed.

The present invention was created in light of the above points; it has as an object thereof to provide a non-volatile semiconductor memory which enables analog data to be written at a high speed and with high accuracy.

SUMMARY OF THE INVENTION

The present invention comprises a semiconductor device which is provided with a first MOS type transistor having a first floating gate which is electrically insulated, a first electrode which is capacitively coupled with said first floating gate, a second electrode which is provided via a tunnel junction with said first floating gate, a third electrode which is capacitively coupled with said second electrode, and a second MOS type transistor which is connected with said first and second electrodes, characterized in that by means of applying a predetermined potential difference between said first and third electrodes, a tunnel-current is caused to flow in said tunnel junction, a charge within said first floating gate is altered, and a mechanism is provided for causing said second MOS type transistor to conduct when said electric charge has reached a predetermined value.

By means of the present invention, feedback operates in each memory cell by turns, and the implantation of charge is completed, without the use of complemented control circuitry, so that extremely high-speed and highly accurate data writing are possible.

(Description of the References)

| | |
|---|---|
| 101, 301, 802 | NMOS transistors, |
| 102, 113, 302, 313, 801 | floating gates, |
| 103 | NMOS drain, |
| 104, 304 | power source line, |
| 105, 305 | sources, |
| 106 | external capacity load, |
| 107, 307 | electrodes, |
| 108, 308 | charge implantation electrodes, |
| 109, 309 | tunnel junctions, |
| 11o | capacity, |
| 111, 311 | terminals for impression of the program voltage ($V_{EXT}$), |
| 112 | NMOS transistor, |
| 114, 314, 316, 406, 409 | switches, |
| 115, 407 | signal lines, |
| 303 | drain electrode, |
| 306 | external load (for example, a capacitor having a capacitive load coefficient $C_0$), |
| 310 | coupling capacity, |
| 312 | control NMOS transistor, |
| 315 | independent gate eleptrode, |
| 401 | enhancement type NMOS, |
| 402 | gate electrode, |
| 403 | inverter, |
| 404 | CMOS inverter, |
| 404a | NMOS |
| 404b | PMOS, |
| 405 | control gate, |
| 408 | electrodes, |
| 701, 702 | select switch, |
| 703 | program electrode, |
| 803 | tunnel junction, |
| 804 | ground electrode, |
| 805 | gate. |

DESCRIPTION OF THE PREFERRED EMBODIMENT

Herein below, embodiments of the present invention will be explained using the diagrams.

(EMBODIMENT 1)

Figure 1:
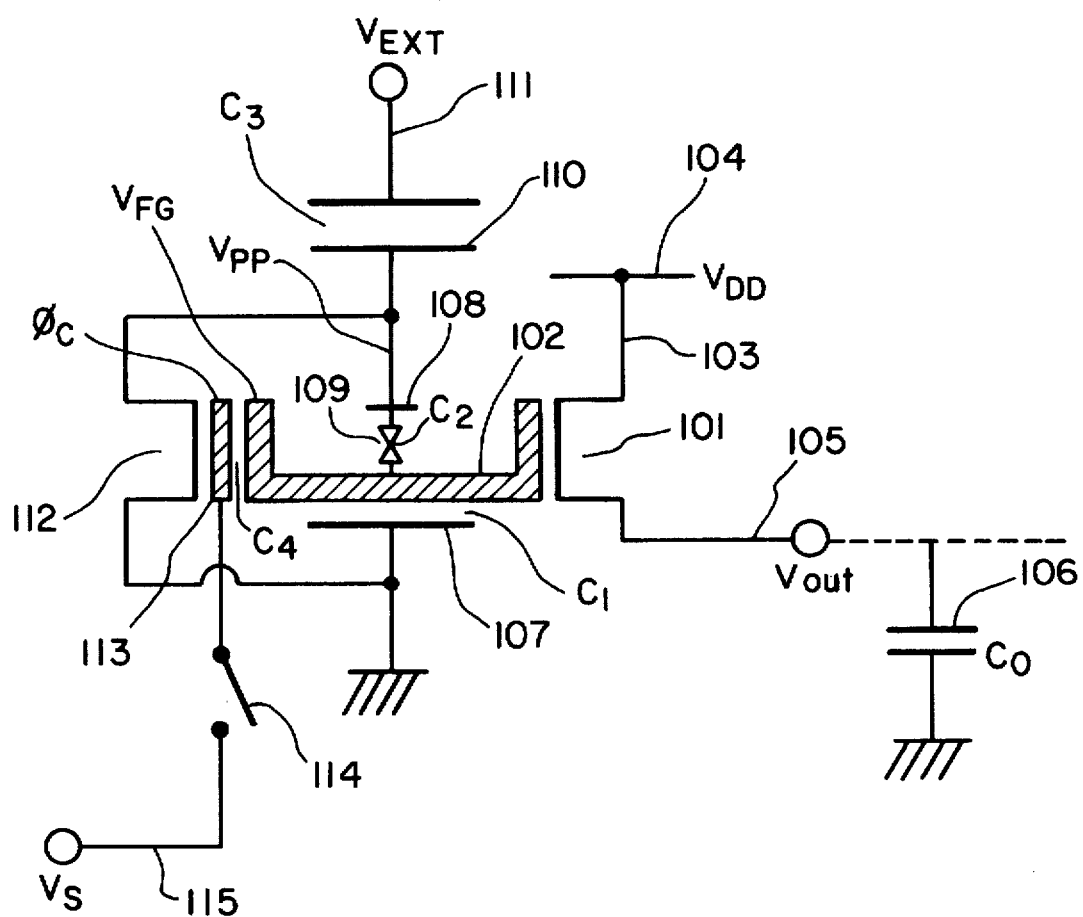
FIG. 1 is a circuit diagram showing a first embodiment.

FIG. 1 is a circuit diagram showing the first embodiment. Reference 101 indicates an NMOS transistor, and reference 102 indicates a floating gate electrode formed from, for example, $N^+$ polysilicon; this controls the ON/OFF state of NMOS 101. The drain 103 of the NMOS is connected to the power source line 104, while source 105 is connected, for example, to an external capacity load 106; the structure is such that the potential $V_{FG}$ of the floating gate 102 is read out to the exterior as $V_{OUT}$, functioning as a source follower circuit. Here, $V_{OUT}=V_{FG}-V_{TH}$; $V_{TH}$ is the threshold voltage as seen from the floating gate of NMOS 101. If $V_{TH}=0$, for example, then $V_{OUT}=V_{FG}$ results. Here, for the purposes of simplicity, $V_{TH}$ is set to 0; even at values other than 0, there is no change in the effects of the present invention. $V_{TH}$ has a fixed value which is determined at the time of manufacture, and the voltage $V_{FG}$ and charge $Q_F$ of the floating gate may be determined in consideration of this. Since $V_{FG}=Q_F/C_{TOT}$ ($Q_F$ indicates the charge of floating gate 102, while $C_{TOT}$ indicates the sum of the capacities connected to the floating gate 102), (Formula 3)

$$V_{OUT}=Q_F/C_{TOT} \tag{3}$$

and by means of this, it is possible to read out the contents of the memory to the exterior. Reference 107 indicates an electrode which is capacitively coupled with floating gate 102; in this example, it is, for example, grounded. The capacitive coupling coefficient thereof is represented by $C_1$. Reference 108 indicates a charge implantation electrode; this is connected to the floating gate via tunnel junction 109. This tunnel junction may be formed by subjecting the surface of a floating gate formed from, for example, $N^+$ polysilicon to thermal oxidation and forming an oxide film having a thickness of 100 Å thereon, and then applying a gate electrode 108 comprising, for example, $N^+$ polysilicon. However, this is only an example of the formation of the tunnel junction; it is of course the case that other materials or methods may be employed to form this junction. The capacity of this tunnel junction 109 is represented by $C_2$. The charge implantation electrode 108 is connected to the terminal 111 for the impression of the program voltage ($V_{EXT}$) via capacity 110 (the size thereof is represented by $C_3$). Reference 112 indicates an NMOS transistor; the ON/OFF, state thereof is controlled by floating gate 113. Floating gate 113 is connected to signal line 115 via switch 114, and when the switch is in an ON state, the potential there of is fixed at the potential $V_S$ of signal line 115. While in the OFF state, the gate is in a floating state, and the potential thereof is determined by the potential of floating gate 102 and the capacitive coupling coefficient with that gate. (The capacitive coupling coefficient between floating gate 102 and floating gate 113 is represented by $C_4$.)

Next, the operation of this circuit will be explained. The case will be considered in which data comprising $V_{FG}=V_m$ is written in floating gate 102. That is to say, a charge of $V_{FG}=C_{TOT}V_m$ is implanted into floating gate 102. This is accomplished by means of the following method.

First $V_S$ is set to $-V_m$, switch 114 is turned on, and the potential $\Phi_C$ of the floating gate 113 is set to $-V_m$. When switch 114 is turned off, a charge of $Q_C=-C_4V_m$ is stored in floating gate 113. (Here, for the purposes of simplicity, it is assumed that the total capacity of floating gate 113 is equal to $C_4$.) If the threshold voltage of NMOS 112 as seen from the floating gate 113 is set to 0V, then NMOS 112 is in an OFF state at this moment and electrodes 107 and 108 are electrically isolated from one another.

When in this state $V_{EXT}=25V$, for example, is impressed in terminal 111 as the program voltage, a voltage $V_T$ which is given by the following formula is applied to both terminals of the tunnel junction 109 as a result of capacitive division.

(Formula 4)

$$V_T = \frac{1/C_2}{1/C_1 + 1/C_2 + 1/C_3} V_{EXT} \quad (4)$$

Now, if $C_2<<C_1$ and $C_3$, then $V_T=V_{EXT}$, a large electric field is generated in tunnel junction 109, and a current is caused to flow and electrons move from floating gate 102 into charge implantation electrode 108. As a result, $V_{FG}$ has a positive value and increases in size. The results obtained by an HSPICE simulation of the changes at this time are show in FIG. 2. $V_{FG}$ increases with time, and $V_{PP}$ decreases with time from $V_{PP}=25V$ at $t=0$, so that it can be seen that a movement in charge occurs.

Since $V_{FG}$ increases, the potential of floating gate 113 also increases as a result of the capacitive coupling therewith, and the value thereof can be expressed by the following formula:

(Formula 5)

$$\Phi_C = \frac{C_4 V_{FG} + Q_C}{C_4} = V_{FG} - V_m \quad (5)$$

That is to say, $V_{FG}$ increases, and when $V_{FG} \geq V_m$ is attained, $\Phi_C \geq 0$ and the threshold voltage 0V of NMOS 112 is exceeded, so that NMOS enters an ON state. When this occurs, electrodes 107 and 108 become electrically connected via NMOS 112, so that the positive charge of electrode 108 flows to the ground, and $V_{PP}$ rapidly diminishes. As a result, $V_T$ is decreased and the tunnel current no longer flows, so that $V_{FG}$ attains a certain value. That is to say, the programming is such that a value of $V_{FG}=V_m$ is attained.

Figure 2:
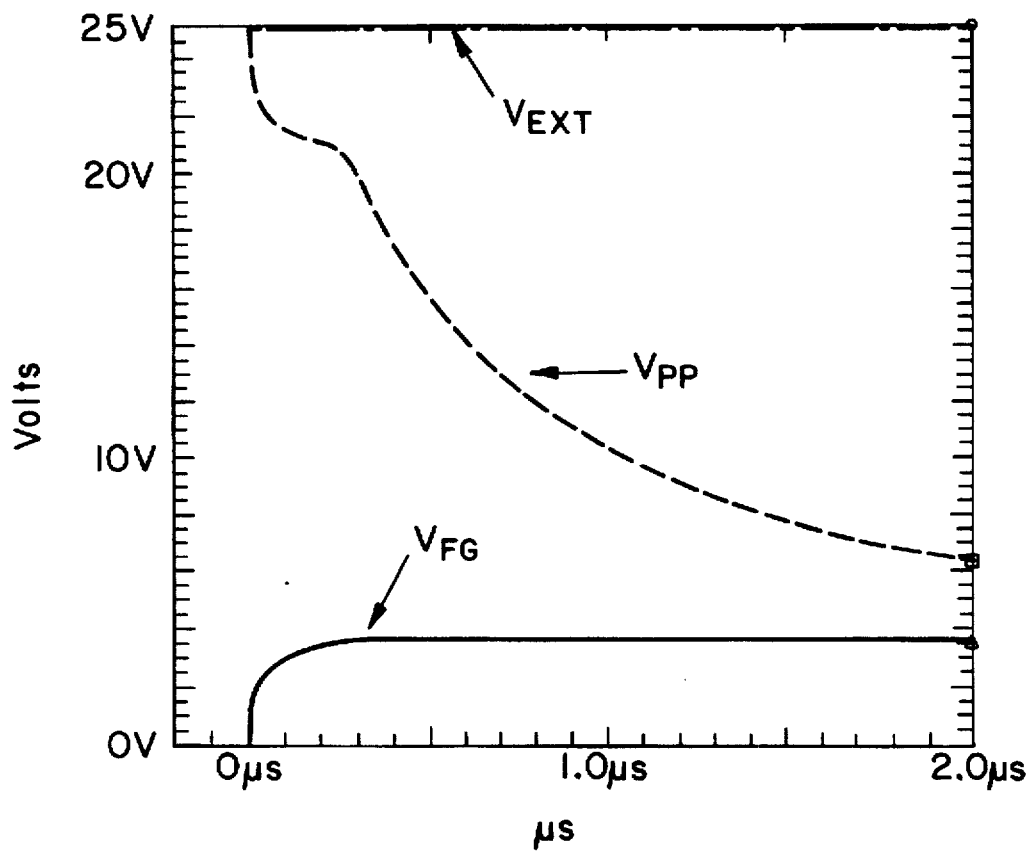
FIG. 2 is a graph showing the results obtained by an HSPICE simulation.

In FIG. 2, $V_m=-4.0V$ is set. Approximately 1.2 µsec after pulse impression, $V_{FG}$ attains a fixed value (approximately 3.5 V). In the conventional example, a long period of time measured in seconds was required for this, and even from this it can be seen that the writing time is dramatically reduced. Here, there is a gap of approximately 0.5 V between the target value $V_m$ of the writing and the actual convergence value of $V_{FG}$; however, if the value $V_m$ is set it advance in consideration of this gap, it is possible to conduct accurate control.

As described above, in the circuitry of the present invention, charge implantation is generated in floating gate 102, and while continuously monitoring in real time $V_{FG}$, which changes as a result of this, a function is realized which automatically terminates implantation when $V_{FG}$ has reached a predetermined value, so that it is possible to write a predetermined value accurately and at very high speed.

In the above, an explanation was given which assumed $C_2<<C_1$ and $C_3$; however, this circuit is not limited to such a condition. First, the condition that $C_2<<C_3$ is only necessary in order to set $V_T$ as close as possible to $V_{EXT}$ so that if, for example, $V_{EXT}$ is made large, or if the tunnel oxide film made thin, or the like, and the electric field acting on the tunnel implantation is made large and a sufficient field value can be obtained, this condition is completely unnecessary. The condition that $C_2<<C_1$ was established so that, in addition to the reasons given above, when $V_{EXT}$ is impressed, the effect raised by the floating gate 102 by means of this voltage can be ignored. For example, if $V_{EXT}=25V$ is impressed, then the potential $\Phi_{FG}$ of the floating gate with respect to the terminal 107 is raised by means of $V_{EXT}$ as a result of the capacitive coupling of $C_1$, $C_2$, and $C_3$ by only the amount given in the following formula:

(Formula 6)

$$V_{FG} = \frac{1/C_2}{1/C_1 + 1/C_2 + 1/C_3} V_{EXT} \quad (6)$$

If $C_2<<C_1$, then, as described above, $\Phi_{FG}$ is essentially equivalent to 0. Even if $C_2$ is not so small as to be easily ignored in comparison with $C_1$, $\Phi_{FG}$ is determined by the values of $C_1$, $C_2$, $C_3$, and $V_{EXT}$, which are known in advance, so that this value can be anticipated, and by means of setting the data which are to be written, it is possible to conduct control which is completely identical to that in the case in which $C_2<<C_1$ and $C_3$. The concrete effects in the case in which $\Phi_{FG}$ can not be expressed by a formula in which, in Formula 5,$V_{FG}$ is replaced by $V_{FG}+\Phi_{FG}$. That is to say, writing is terminated when $\Phi_C=V_{FG}+\Phi_{FG}-V_m=0$, so that data comprising $V_{FG}=V_m-\Phi_{FG}$ are written into floating gate 102. That is to say, a value which is smaller by a certain value than the set value $V_m$ is written. If control which writes data which are larger by only the amount of this $\Phi_{FG}$ is conducted, it is possible to conduct control which is unchanged.

When the data which have been written are to be read out, by means of operating a source follower circuit employing NMOS 101 (the threshold voltage $V_{TH}$ thereof as viewed from floating gate 102 is, for example, set to 0V), it is possible to directly read out the voltage of the floating gate 102 as an analog voltage, so that $V_{OUT}=V_{FG}$. It is not absolutely necessary that the threshold voltage $V_{TH}$ of NMOS 101 be 0V; when VTH has a limited value, $V_{OUT}=V_{FG}-V_{TH}$ is read out as analog data.

Furthermore, in the example shown in FIG. 1, an example was shown in which a capacity (represented by $C_O$) is employed as the load element of the source follower; however, this is not necessarily so limited, and it is of course the case that, for example, a resistor may be employed, or a load element constructed using an MOS transistor.

Furthermore, if a plurality of memory cells are integrated in a matrix shape, in order to selectively read out the data of a predetermined cell, by means of selectively raising, for example, power source line 104 to $V_{DD}$, only the source follower which is connected to this power source line is activated and read out occurs, or, alternatively, line 104 may be constantly kept at a fixed voltage of $V_{DD}$, and an MOS transistor for selection may be disposed for each cell at $V_{OUT}$ terminal 105.

In the first embodiment described above, it was necessary to provide a negative value of $-V_m$ as $V_s$ in order to read out the value of $V_m$; however, in order not to generate a negative signal, the following procedure may be followed.

If the threshold voltage of NMOS 102 is taken to be VTH', then the conditions under which this NMOS enters an ON state are, from Formula (5):

(Formula 7)

$$\Phi_C = V_{FG} - V_m > V_{TH}' \qquad (7)$$

That is to say, $-V_m > \text{VTH}' - V_{FG}$, and in order to write $V_{FG}$ into the gate, the following may be established:

(Formula 8)

$$-V_m > \text{VTH}' - V_{FG} \qquad (8)$$

If $V_{TH}'$ is set equal to 5V, for example, then in order to write 0, 1, 2, 3, 4 (V) as $V_{FG}$, $V_m$=5, 4, 3, 2, 1 (V) may be established and $V_m$ will thus constantly have a positive value. That is to say, the voltage for writing control which is to be established as $V_S$ always has a positive potential, and there is no need to generate a negative signal.

A separate method may be employed as the method of establishing the writing data in the circuit of FIG. 1. This is explained in the following. First, after switch 114 enters an ON state, $V_S$ is set to 0V, and the potential of electrode 107 is set to $V_m$. Now, if $C_1 \gg C_2$, then $V_{FG} = Vm$ results. After this, one switch 114 enters an OFF state, a charge of $Q_C = -C_4 V_m$ is stored in floating gate 113. When in this state writing commences, $\Phi_C$ changes in accordance with Formula (5), and if the threshold voltage of NMOS 112 is set to, for example, 0V in advance, then when $\Phi_C = 0$, that is to say, $V_{FG} = V_m$, NMOS 112 enters an ON state, and charge implantation into floating gate 102 is terminated. If this method is employed, then it is possible to employ non-negative values as writing voltages even without setting the threshold voltage of NMOS 112 to an especially high value.

Furthermore, the threshold voltage of NMOS 112 need not be 0V, but may have a limited value, and at this time a value of $V_m - V_{TH}'$ may be written into floating gate 102. Alternatively, if when switch 114 enters an ON state and the potential of electrode 107 is set to $V_m$, $V_S = V_{TH}'$ is established, and then the value of $V_m$ is written in an unchanged manner into floating gate 102.

If is of course the case that no matter which data establishment method described above is employed, the effects of the present invention are obtained.

The above explanation is only applicable to the case in which, in the state prior to the first impression of a program voltage ($V_{EXT}$) in the terminal 111 for programming voltage impression, no charge exists in the floating gate 102. That is to Say, the writing method which was first explained was correct only for the case in which $V_S = -V_m$ and, when a charge was set in floating gate 113, VFG=0V. If at this time a charge exists in the floating gate 102, and $V_{FG} = V_{FGO} \neq 0$ is assumed, then $V_S = -V_m$, a voltage for writing control is set in floating gate113, and a programing voltage is applied to $V_{EXT}$; then, when $V_{FG}$ has risen to $V_m + V_{FGO}$, control transistor 112 enters an ON state for the first time, and a voltage of $V_m + V_{FGO}$ will be written into floating gate 102. Accordingly, in the case in which a charge already exists therein, for example, VFGO may be previously read out utilizing the source follower operation of NMOS 101, and a value of $V_S$ may be set in consideration of this $V_{FGO}$ effect; that is to say, $V_S = -(V_m - V_{FGO})$ may be set. In this may, it is possible to write a value of $V_{FG} = V_m$ even if a charge exists initially.

Next, various methods will be explained for writing of data on a floating gate into which data have already been written once.

The establishment of $V_{FG}=0$, that is to say, the setting of the charge of floating gate 102 to 0, is easily accomplished; this may, for example, be accomplished by irradiation with UV light in the state in which the potential of electrode 107 is 0.

A possible method for the erasure of data maintained electrically in floating gate 102 is, for example, the application of a negative voltage to $V_{EXT}$ and the implantation of electrons in the floating electrode. Alternatively, a method may be employed in which a positive potential is applied to electrode 107 in a state in which the terminal 111 for programming voltage impression is grounded, and electrons are implanted in the floating gate. Furthermore, another method involves providing a further tunnel junction for electron implantation in addition to junction 109, and erasing a number of cells at once. A still further method is one in which, for example, power source line 104 is set to a voltage larger than $V_{DD}$ in a state in which the $V_{OUT}$ terminal 105 in FIG. 1 has been reset to 0V; hot electrons are then generated at the drain terminal of NMOS 101, and by means of the implantation of these hot electrons into floating gate 102, the positive charge is canceled. At this time, by means of setting electrode 107 to various potentials, it is possible to control the amount of this implantation. Another method for the implantation of hot electrons into the floating gate, even if transistor 101 is not employed, involves the separate provision, for the sole purpose of implantation, of a short channel transistor which facilitates the generation of hot electrons, and the usage of the gate electrode thereof together with floating gate 302. In the various electrical methods described above, the charge in floating gate 102 is commonly not precisely 0, and sometimes attains negative values, so that it is necessary at such times to read out the amount of charge using a source follower operation and to adjust $V_S$ or the voltage which is applied to electrode 107 in consideration of this.

In the foregoing, various data update methods were explained; however, it is of course the case that any of the methods described above may be employed.

(EMBODIMENT 2)

Figure 3:
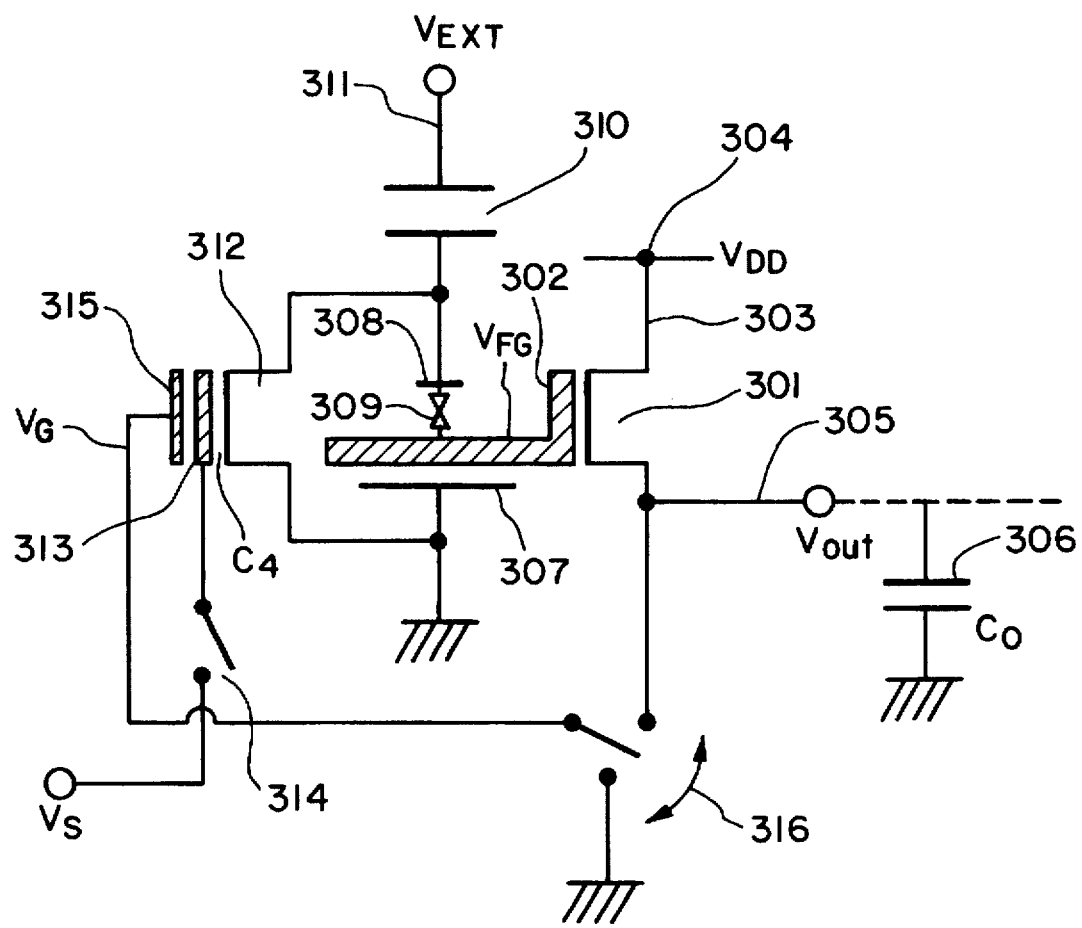
FIG. 3 is A circuit diagram showing a second embodiment.

FIG. 3 shows a second embodiment of the present invention. Reference 301 indicates an NMOS transistor, while reference 302 indicates a floating gate which controls the ON and OFF state thereof. Reference 303 indicates a drain electrode, which is connected to power source line ($V_{DD}$) 304, and the source 305 thereof is connected to an external load (for example, a capacitor 306 having a capacitive load coefficient $C_0$); the structure is one in which the potential $V_{FG}$ of the floating gate is read out as $V_{OUT}$ as a source follower circuit. Furthermore, the structure of electrode 307, charge implantation electrode 308, tunnel junction 309, coupling capacity 310, and terminal 311 for program voltage ($V_{EXT}$) impression is identical to that given in the first embodiment of FIG. 1, so that a detailed description there of will be omitted here. The major difference in this second embodiment is the control NMOS transistor 312; the floating gate 313 which controls the ON and OFF state is capacitively coupled with the independent gate electrode 315. (The capacitive coupling coefficient between gate 315 and floating gate 313 is represented by $C_4$, and $C_4$ is set so as to be sufficiently large in comparison with the gate oxide film capacity of NMOS 312. This is assumed for the purposes of simplicity of the explanation; in actuality there is no change in the effects of the present invention even if this condition is not fulfilled.) The connection of floating gate 313 to signal line $V_S$ via switch 314 is as in FIG. 1. Gate 315 can be connected to a ground potential or the source of NMOS 301 via switch 316.

The writing of the present cell is conducted as follows. The case will be considered in which, in order to raise the voltage $V_{FG}$ of the floating gate 302 to $V_m$ and conduct writing in the same manner as in the first embodiment, the threshold voltage of NMOS 312 and the threshold voltage NMOS 301 are both, for example, $V_{TH}$=V. It is not necessary to set the threshold voltages of both NMOS to 0V as in the first embodiment. Furthermore, with the exception that the setting of the writing data is conducted in a state in which switch 316 is set to the ground side, and the fact that the impression of the program voltage is conducted in a state in which, after switch 314 has entered an OFF state, switch 316 is connected to the source 305 of NMOS 301, the operation is identical to that of Embodiment 1. That is to say, during writing, the source follower circuit of NMOS 301 is operated and the gate voltage Vg of control NMOS transistor 312 becomes $V_{FG}$, so that when $V_{FG}=V_m$, the control transistor 312 enters an ON state, and writing is terminated by means of a principle which is identical to that of Embodiment 1. The conditions for the size of $C_1$, $C_2$, and $C_3$ are also identical to those of the first embodiment, and even if $\Phi_{FG}$, which was discussed in the first embodiment, can not be ignored as a result of $V_{EXT}$, this will have a determined value, so that the control data can be set in anticipation of this value.

The major difference with the first embodiment is the voltage setting of floating gate 313; however, this is conducted when the potential of 315 is or that is to say, $V_G$=0, so that even if an initial charge is present in floating gate 302, this will have absolutely no effect. That is to say, as explained in Embodiment 1, with respect to $V_{FG}$ prior to writing, the effect of the value of $V_{FG0}$ can be ignored, and this is a chief characteristic feature. No matter what the value of $V_{FG0}$, when $V_G=V_{FG}=V_m$, then control transistor 312 enters an ON state, so that, the operation which was necessary in the circuit of FIG. 1, in which the source follower circuit of NMOS 301 was operated and $V_{FG0}$ was read out at the time of each data update, and the setting potential of $V_S$ was determined in consideration of this value, is not necessary. Accordingly, even if the UV method of erasure is not employed, when any of the electrical erasure methods described in the first embodiment are employed, such as the method in which a negative voltage is impressed as $V_{EXT}$ or a positive voltage is impressed in electrode 307, or the various hot electron implantation methods, or alternatively the dedicated tunnel junction for electron implantation is used, the writing operation can be easily conducted in a manner identical to that seen when floating gate 302 is 0V. By means of the present cell, even if a negative charge remains in the floating gate as a result of excessive electron implantation during erasure, it is possible to always write a predetermined value, and furthermore, it is possible to realize high speed data writing.

Furthermore, in this cell as well, as in the first embodiment, it is of course the case that differing data setting methods may be employed, such as, for example, setting $V_S$=0 and applying a value of Vm to electrode 307, or, after setting $V_S$=0, connecting switch 316 to output line 305 and applying a voltage of $V_m$ to the output line, or the like. With respect to switch 316, $V_G$=0 may be set during data setting, so that, for example, a number of output lines 305 of the cells may be bundled, and a plurality of cells maybe attached to a single common switch. Furthermore, there is no necessity of setting 0V; other predetermined voltages maybe set. For example, if an PMOS is employed as control transistor 312, the set voltage maybe $V_{DD}$.

(EMBODIMENT 3)

Figure 4:
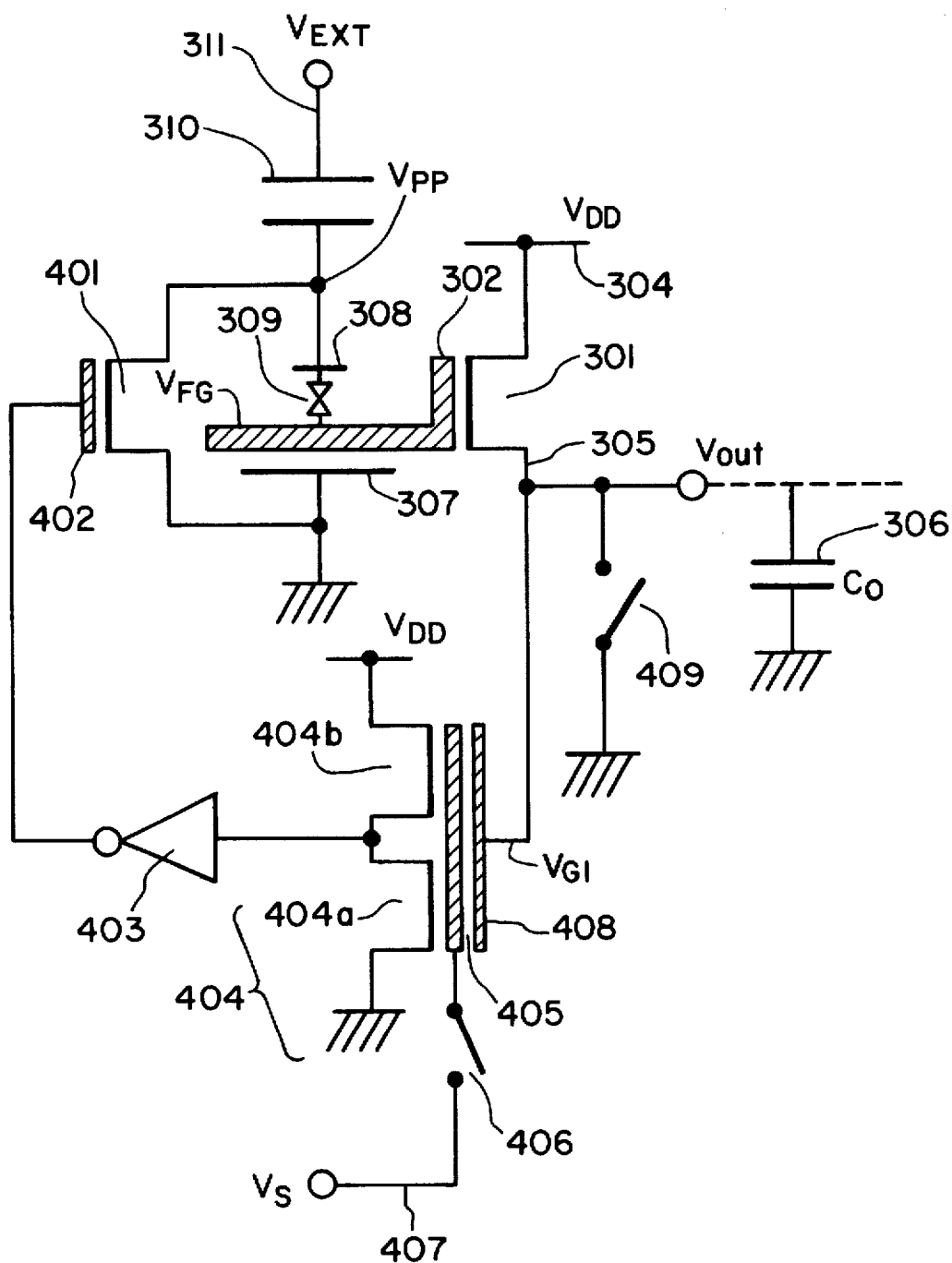
FIG. 4 is a circuit diagram showing a third embodiment

FIG. 4 shows a third embodiment of the present invention. In the present embodiment, parts which are identical to those of FIG. 3 are given identical reference numbers, and a further explanation of such parts will not be given. The point of difference between FIG. 4 and the second embodiment is that, in contrast to FIG. 3, in which an NMOS 312 having a floating gate 313 was employed as the transistor which connects electrode 307 and electrode 308, in the present embodiment, a standard enhancement type NMOS 401 is employed. The gate electrode 402 thereof is connected, for example, to the output of an inverter 403 having an inversion voltage of, for example, $V_{DD}/2$, and the ON/OFF state of NMOS 401 is controlled by means of the output thereof. If the inversion voltage has a value within a range of from $|V_{DD}|$ too, then the effects of the present invention are theoretically unchanged. Furthermore, a common CMOS inverter maybe employed as this inverter 403, and it is of course the case that a E/E type inverter employing an NMOS or PMOS, or a E/D type inverter may also be employed. Reference 404 also indicates a CMOS inverter; it comprises NMOS 404a and PMOS 404b. The common gate 405 is connected to signal line 407 via switch 406, and when 406 is turned off, this gate 405 is in a floating state. When in a floating state, the potential thereof is controlled by the potential of control gate 408 and the capacitive coupling therewith. The capacitive coupling coefficient between 405 and control gate 408 is represented by $C_4$. It will be assumed that $C_4$ is sufficiently large with respect to the total of the gate oxide film capacities of NMOS 404a and PMOS 404b. This assumption is made for the purposes of facilitating the explanation; it is of course the case that effects of the present invention will be unchanged even if this condition is not fulfilled. Control gate 408 is connected to source 305 of NMOS 301, and furthermore, reference 409 indicates a switch for resetting the output terminal to 0V. The inversion threshold voltage of CMOS 404 is set to, for example, 0V. This makes, for example, NMOS 404a a depression transistor, and the threshold voltage thereof is set to −2.5V, while PMOS 404b is an enhancement transistor, and the threshold voltage thereof is set to −2.5V, and the β ratio ($\beta_R$=the β of the NMOS/the β of the PMOS) of both channel MOS may be set to 1. Furthermore, the threshold voltage of NMOS 301 is set to, for example, 0V. There is no change in the effects of the present invention even if this has a limited value instead of 0V, and this is as explained in the first and second embodiments.

Here, as in the first and second embodiments, the case will be considered in which the data $V_m$ is written into floating gate 302, and $\Phi_{FG}=V_m$.

First, there set switch 409 is set to ON, and the potential $V_{G1}$ of 408 is set too. Next, switch 406 is turned on, and $V_S$ is set equal to $-V_m$. After this, if the switch 406 is turned off, the data setting for writing control will be terminated. Next, switch 409 is turned on and after the source follower has been placed in an operational state, $V_{EXT}$=25V, for example, may be impressed in the terminal for the programming voltage impression. A tunnel current flows and the potential $V_{FG}$ of 302 rises; however, this becomes the potential of 408 via the source follower circuit of NMOS 301. That is to say, $V_{G1}=V_{FG}$. Here, for the purposes of simplicity, as in the first and second embodiments, C2<<C1 is established, so that the effect of a rise by a fixed value in the potential of the floating gate by means of capacitive coupling as result of the impression of $V_{EXT}$ can be ignored. Even if this is not so set, as explained in the first and second embodiments, the effects of the present invention are unchanged. The potential $\Phi_{C1}$ of the floating gate 406 is $\Phi_{C1}=V_{G1}-Vm=VFG-V_m$, so that when $\Phi_{C1}$ is no longer equal to the inversion voltage 0V of CMOS inverter 404, inverter 404 inverts and the output thereof becomes 0V. This signal is further inverted and the gate electrode 402 is raised to $V_{DD}$, so that the NMOS 401, which is set so as to be an enhancement type transistor, enters an ON state, and the charge implantation electrode 308 is grounded, the tunnel current ceases to flow, and writing is terminated. That is to say, data writing is terminated when $V_{FG}=V_m$ (with the condition that $\Phi_{C1}=0$), and data comprising $V_{FG}=V_m$ are written into floating gate 307.

Figure 5:
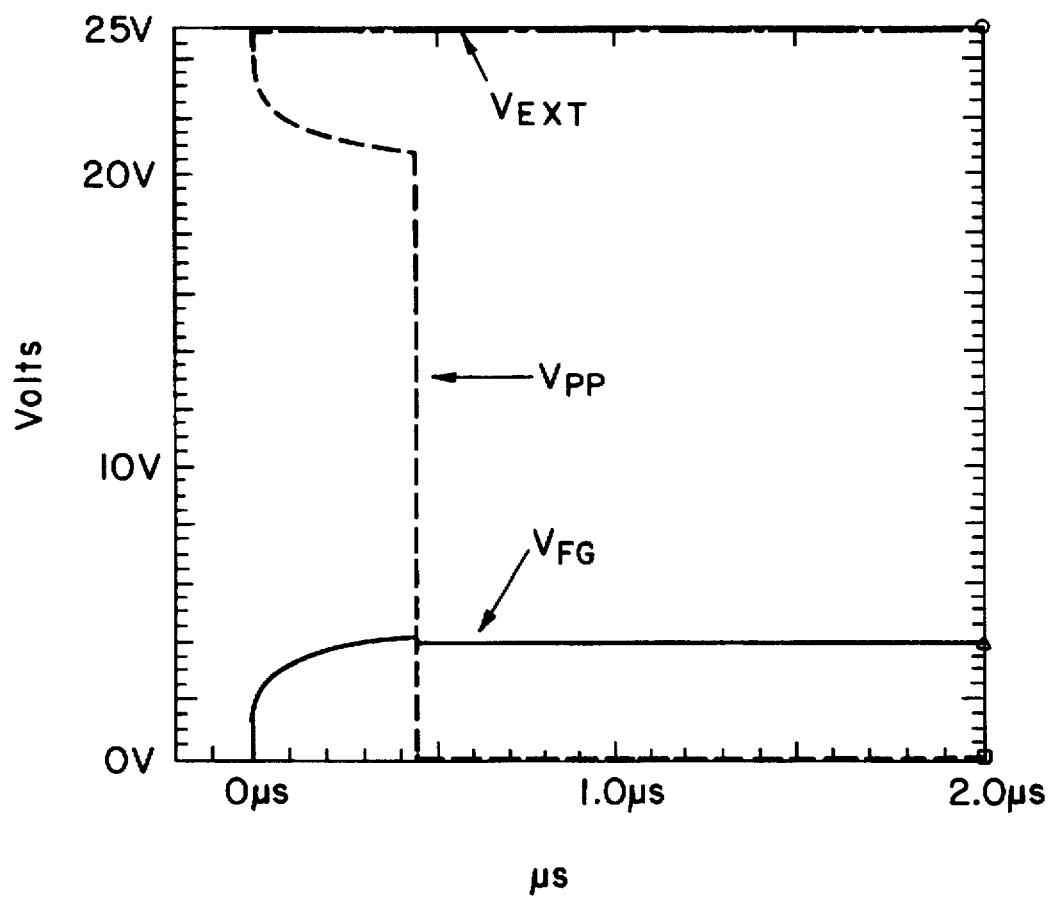
FIG. 5 is a graph showing the results obtained by an HSPICE simulation.

The results of an HSPICE simulation of this operation are shown in FIG. 5. Vm is set equal to 4V. When $V_{FG}$ reaches a predetermined value, $V_{PP}$ drops rapidly to 0V, and a rapid discharge of the charge implantation electrode 308 takes place. Furthermore, it can be seen that the written value is 3.9V, the time of the termination of writing is 0.5 μsec, and $V_{FG}$ thus converges in an extremely accurate manner and at high speed on the target value. By means of the present third embodiment, analog data writing which is even faster and more accurate can be realized.

Furthermore, in the present cell, as well, as explained in the first and second embodiments, it is of course the case that data may be established for writing control by means of a different method. That is to say, as is the case in the second embodiment, a method may be adopted in which a value $V_m$ is applied to output terminal 305 or electrode 307, and after $V_{G1}$ has been set to the predetermined writing value $V_m$, switch 406 is placed in an ON state, $V_S$ is set equal to 0V, and when switch 406 is subsequently placed in an OFF state, data setting is thereby accomplished.

Furthermore, in the present embodiment a case was described in which are set switch 409 was used; however, it is of course the case that the switch 316 which is used in FIG. 3 may also be employed.

Additionally, in the present embodiment, the ON/OFF state of NMOS 402 is controlled by means of the output of inverter 403; however, there will be no change in the effects of the present invention if this inverter 403 is eliminated, and NMOS 402 is converted to a PMOS. The inverter 404 for writing control outputs a value of 0V when writing is to be terminated, so that it is impossible to place the NMOS in an ON state as a result of writing termination. Accordingly, an inverter 403 which inverts this output is employed. Furthermore, it is of course the case that even if two or more stages of inverters are placed on the output of control inverter 404, and an appropriate channel is selected for MOS which causes a short circuit between terminal 307 and terminal 308, there is absolutely no change in the effects of the present invention.

A special inverter having an inversion voltage of 0V was employed as the inverter 404 which was used in the present invention; however, there is no change in the effects of invention if a common inverter employing $V_{DD}/2$ is used, and in such a case, the conditions for the termination of writing are $\Phi_{C1}=V_{FG}-V_m=V_{DD}/2$, and a voltage of $V_{FG}=V_{DD}/2+V_m$ is written. If control is conducted in view of the amount of change, it is possible to write the targeted values.

Furthermore, in the present embodiment, in order to update the value of the floating gate 302 which has been written into once, a method identical to that described in the second embodiment is employed. The operation which was necessary in the first embodiment, in which the voltage of the floating gate was read out after electrical erasure, is not necessary.

(EMBODIMENT 4)

Figure 6:
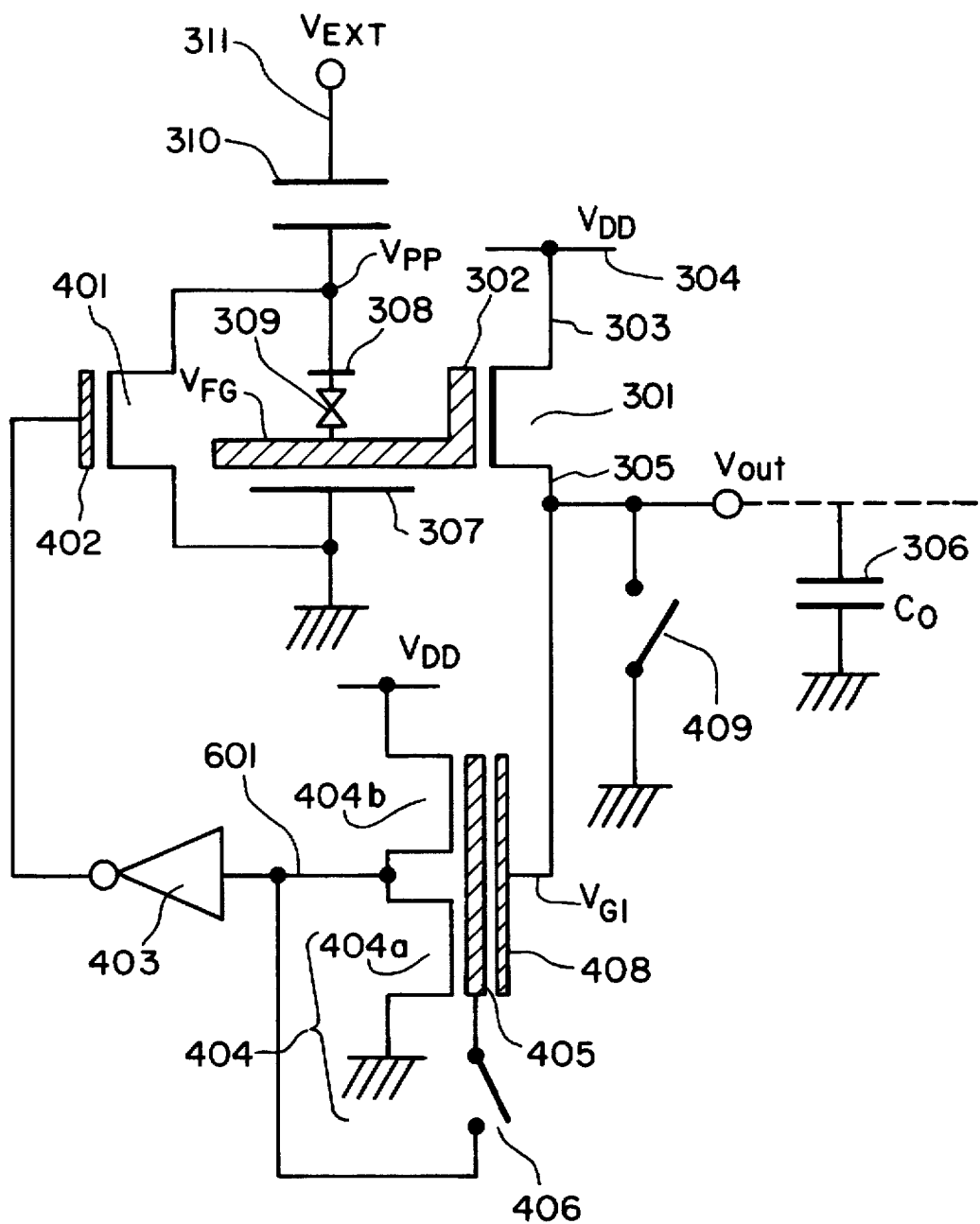
FIG. 6 is a circuit diagram showing a fourth embodiment.

FIG. 6 shows a fourth embodiment of the present invention. The structure is almost identical to that of FIG. 4, and identical parts are given reference numbers identical to those in FIG. 4. The point of difference is that the floating gate 405 is connected to the output terminal 601 of the inverter via switch 406. By means of this, it is possible to further increase the writing accuracy.

The setting of the writing data is accomplished by setting the voltage $V_{OUT}$, of, for example, the output terminal, to $V_m$, setting gate electrode 408 to a predetermined writing voltage $V_m$, and placing switch 406 in an ON state. When this is done, when the input voltage and output voltage of inverter 404 become equal, that is to say, when the inverter has reached the inversion voltage, resetting occurs. In this state, if switch 406 is placed in an OFF state, when 408 again returns to $V_m$, inverter 404 accurately inverts. If such a resetting method is employed, even if the in version voltage of the inverter diverges from the designed value, when $V_m$ is reached, the output inverts, so that even if variations a reproduced in the dimensions or threshold voltages of NMOS 404a and PMOS 404b from chip to chip as a result of variations in the manufacturing processes, such variations will have no effect, and at any time at which $V_{G1}=V_m$, the writing control inverter 404 will invert, and tunnel implantation will be interrupted. By means of this, highly accurate analog data writing can be realized.

In the fourth embodiment described above, the case was discussed in which, when the potential of gate electrode 408 is set to $V_m$, a voltage is directly externally applied to the $V_{OUT}$ terminal. When the memory cells are arranged in a matrix, a suit able switch transistor may be provided so as to make selection possible to conducts elective writing. Furthermore, a switch which cuts off the suitable source follower transistor 301 may be provided.

(EMBODIMENT 5)

Figure 7:
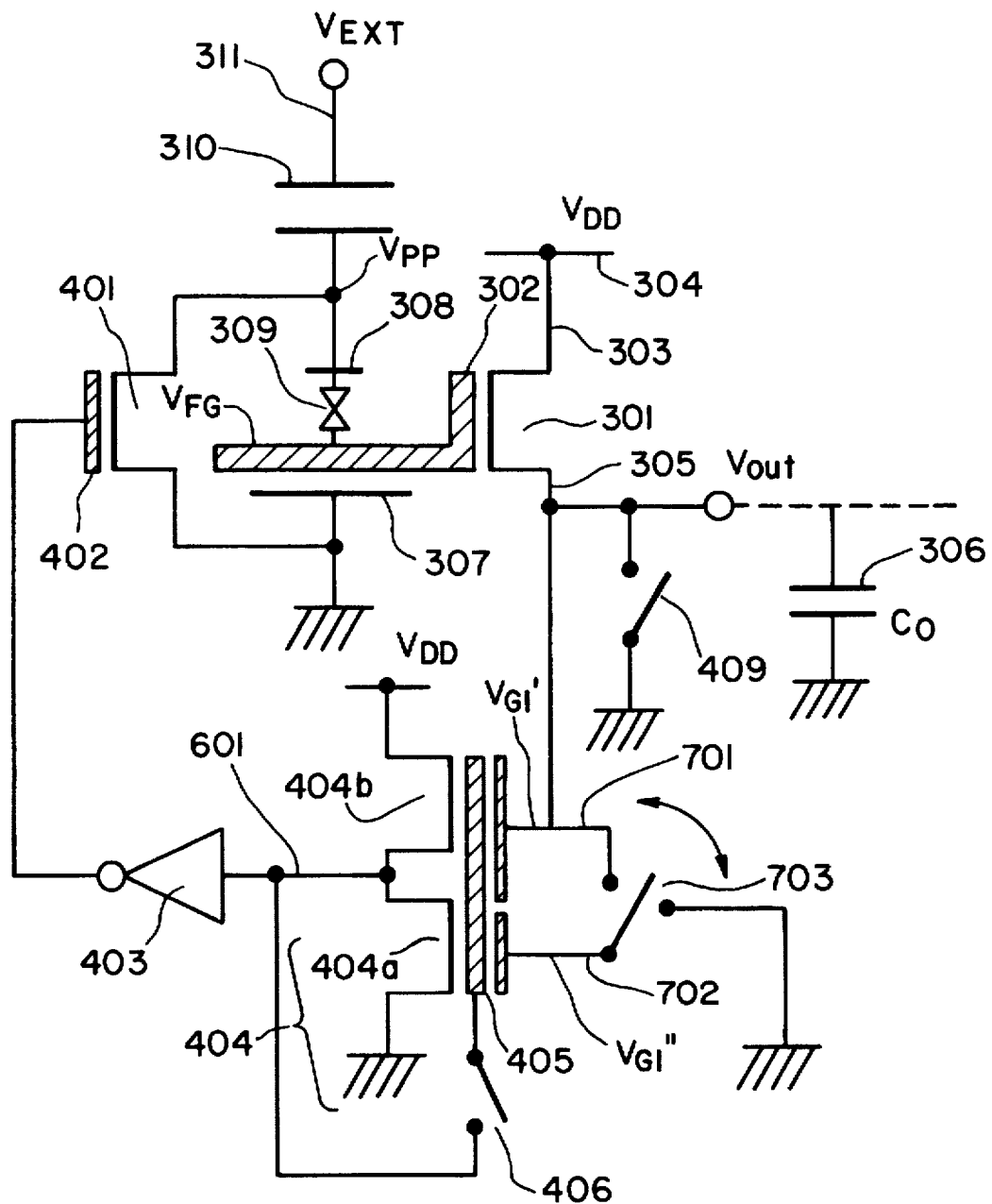
FIG. 7 is a circuit diagram showing a fifth embodiment.
Figure 8:
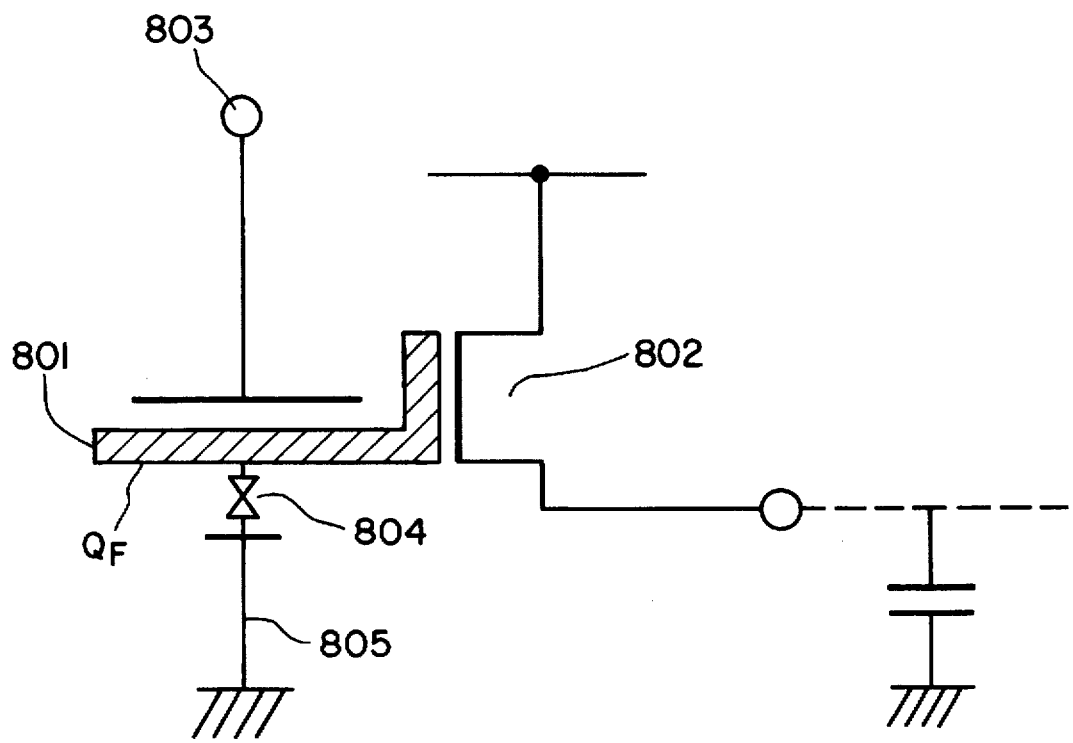
FIG. 8 is a circuit diagram showing a conventional example.
Figure 9:
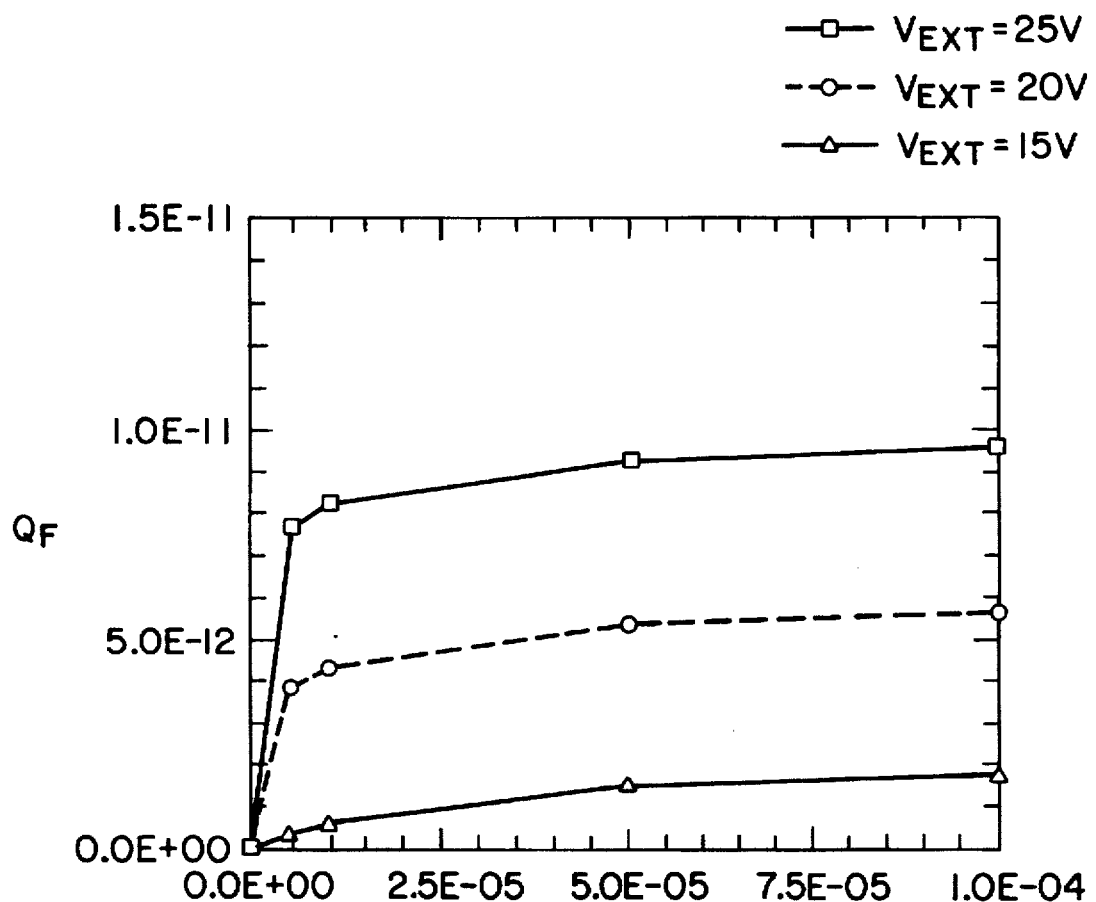
FIG. 9 is a graph showing the results obtained by means of an HSPICE simulation.
Figure 10:
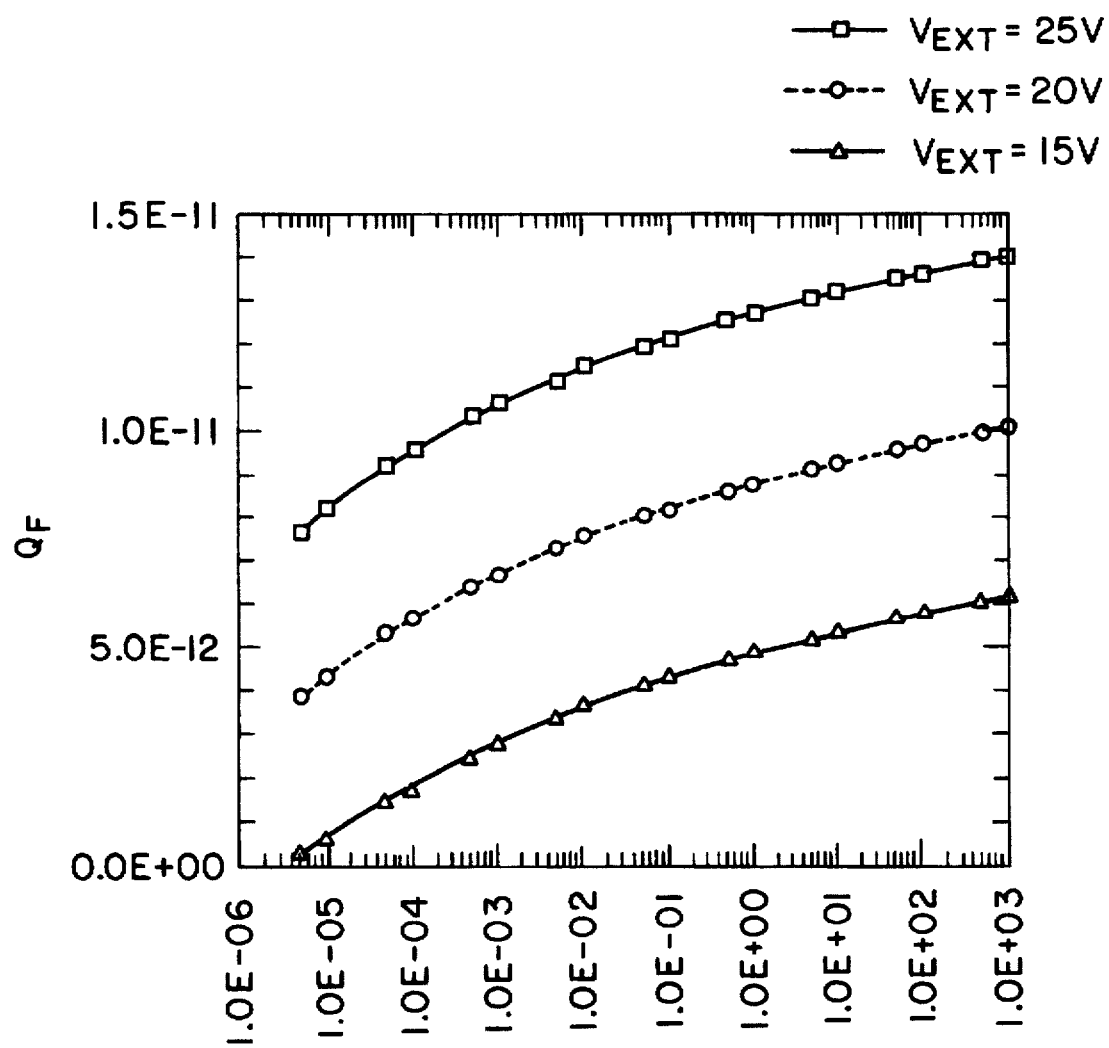
FIG. 10 is a graph in which the time in the graph of FIG. 9 is placed on an exponential scale.

FIG. 7 shows a fifth embodiment of the present invention. Most of the structure is identical to that of FIG. 6, and parts which are identical are given identical reference numbers. The chief points of difference are that the electrode 408 of FIG. 6 has been divided into two electrodes 701 and 702 in FIG. 7, and a select switch 703 is provided. By means of the present invention, after data has once been written in the floating gate 302, small corrections are possible in the voltage $V_{FG}$ thereof. Once switch 703 is connected to 701 and operation is under taken, the operation is identical to that of the sixth embodiment. The slight correction of the operation is conducted in the following manner.

In the state in which switch 703 is thrown to the 701 side, the switch 409 is turned off, and the source follower circuit of transistor 301 is operated. When this is done, the potential of gates 701 and 702 become equivalent, and $V_{G1}40=V_{G1}''=V_{FG}$. In this state, switch 406 is turned on, and the inverter is reset to the inversion voltage state. After this, switch 406 is turned off, and there after switch 703 is moved to the ground side. When this is done, the voltage of floating gate 405 is reduced by electrode 702. That is to say, the voltage of the input gate of the inverter 404 which was reset in the inversion voltage state decreases, so that the output becomes $V_{DD}$, this is inverted at inverter 403; and the potential of gate 402 is set to 0V, so that the transistor 401 enters an OFF state. In this state, if $V_{EXT}$=25V, for example, is applied to the terminal for programming voltage impression, when the value of $V_{FG}$ has increased by $\Delta V_{FG}$, NMOS 401 enters an ON state, and programming is terminated. Here, $\Delta V_{FG}$ is the difference between the inversion threshold voltage 404 and the gate voltage of inverter 404 after being reduced by electrode 702. Now, if the capacitive coupling coefficient between electrodes 701 and 702 has a ratio which is set to n:1, then the following results:
(Formula 9)

$$\Delta V_{FG} = V_{FG}/n \quad (9)$$

Here, the larger the value of n, the finer the adjustments which can be made, additionally, if the ground side of switch 703 is set to a predetermined voltage, even finer adjustments can be made. Of course, data erasure and update can be conducted as in the fourth embodiment.

The number of inverters connected to the output of inverter 404 for writing control may be any freely selected number greater than or as in the fourth embodiment, and this will cause no change in the effects of the present invention.

In the first through fifth embodiments described above, transistors 101, 301, 112, 312, 401, and the like were described as NMOS transistors; however, it is of course the case that the power source voltage may be adjusted and PMOS transistors employed. Furthermore, it is of course the case that, as with the invertors 403 and 404 of FIG. 7, circuits for writing control need not be disposed at each cell: a number of cells may have such circuitry in common, and switching may be accomplished by means of a switch.

In accordance with the present invention, it is possible to provide a non-volatile semiconductor memory which is capable of high-speed and highly accurate analog data writing.

We claim:

1. A non-volatile semiconductor memory device, comprising: a first MOS type transistor having a first floating gate which is electrically isolated, a first electrode which is capacitively coupled with said first floating gate; a second electrode which is connected to said first floating gate via a tunnel junction; a third electrode which is capacitively coupled with said second electrode; a second MOS type transistor including a source and drain which interconnect said first and second electrodes; and means for applying a predetermined potential difference between said first and third electrodes to thereby cause a tunnel current to flow through said tunnel junction and to store an electric charge on said first floating gate thereby causing said second MOS type transistor to conduct when said electric charge has reached a predetermined value.

2. A non-volatile semiconductor memory device in accordance with claim 1, wherein said second MOS-type transistor includes a second floating gate which is capacitively coupled with said first floating gate.

3. A non-volatile semiconductor memory device in accordance with claim 2, wherein said second MOS type transistor includes a second floating gate which is connected with a signal line via a switch.

4. A non-volatile semiconductor memory device in accordance with claim 1, wherein said second MOS type transistor includes a second floating gate, which is capacitively coupled with the source of said first MOS-type transistor.

5. A non-volatile semiconductor memory device in accordance with claim 1, wherein said second MOS type transistor includes a second floating gate which is connected with a signal line via a switch.

6. A non-volatile semiconductor memory device in accordance with claim 1 including a first inverter circuit comprising at least one third MOS type transistor, said third MOS type transistor generating an output signal, the ON/OFF state of said third MOS type transistor controlled by means of a third floating gate which is capacitively coupled with the source of said first MOS type transistor, a second inverter circuit for inverting said output signal whereby the ON/OFF state of said second MOS type transistor is controlled.

7. A non-volatile semiconductor memory device in accordance with claim 6, characterized in that said third floating gate is connected to a signal line via a switch.

8. A non-volatile semiconductor memory device in accordance with claim 6, including a switch for connecting said third floating gate to an output terminal of said first inverter circuit.

* * * * *